(12) United States Patent
Anderson et al.

(10) Patent No.: US 8,354,319 B2
(45) Date of Patent: Jan. 15, 2013

(54) INTEGRATED PLANAR AND MULTIPLE GATE FETS

(75) Inventors: Brent A. Anderson, Jericho, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 29 days.

(21) Appl. No.: 12/905,575

(22) Filed: Oct. 15, 2010

(65) Prior Publication Data

US 2012/0094465 A1    Apr. 19, 2012

(51) Int. Cl.
*H01L 21/336* (2006.01)
(52) U.S. Cl. ............... 438/275; 438/294; 257/E21.409
(58) Field of Classification Search .......... 438/149, 438/151, 164, 275, 294, 296; 257/288, E21.4, 257/E21.409
See application file for complete search history.

(56) References Cited

U.S. PATENT DOCUMENTS

| | | | |
|---|---|---|---|
| 6,949,768 B1 | 9/2005 | Anderson et al. | |
| 6,974,729 B2 | 12/2005 | Collaert et al. | |
| 7,352,034 B2 | 4/2008 | Booth, Jr. et al. | |
| 7,371,644 B2 * | 5/2008 | Yagishita et al. | 438/268 |
| 7,932,564 B2 * | 4/2011 | Goto et al. | 257/368 |
| 8,076,203 B2 * | 12/2011 | Fujimoto | 438/283 |
| 8,106,459 B2 * | 1/2012 | Chang et al. | 257/353 |
| 2005/0093028 A1 * | 5/2005 | Chambers | 257/250 |
| 2005/0167750 A1 * | 8/2005 | Yang et al. | 257/347 |
| 2005/0285204 A1 * | 12/2005 | Kim et al. | 257/368 |
| 2006/0081895 A1 * | 4/2006 | Lee et al. | 257/288 |
| 2006/0084212 A1 * | 4/2006 | Anderson et al. | 438/197 |
| 2007/0018239 A1 | 1/2007 | Chen et al. | |
| 2007/0080387 A1 | 4/2007 | Liu et al. | |
| 2007/0080409 A1 * | 4/2007 | Seliskar | 257/401 |
| 2007/0138514 A1 | 6/2007 | Chang | |
| 2007/0170474 A1 * | 7/2007 | Kawasaki | 257/288 |
| 2007/0221956 A1 * | 9/2007 | Inaba | 257/197 |
| 2008/0020515 A1 | 1/2008 | White et al. | |
| 2008/0029821 A1 * | 2/2008 | Yamagami et al. | 257/365 |
| 2008/0142806 A1 * | 6/2008 | Anderson et al. | 257/67 |
| 2008/0315282 A1 * | 12/2008 | Cho et al. | 257/315 |
| 2009/0008716 A1 * | 1/2009 | Goto et al. | 257/365 |
| 2009/0032887 A1 * | 2/2009 | Jang et al. | 257/407 |
| 2009/0090976 A1 * | 4/2009 | Kavalieros et al. | 257/369 |
| 2009/0294874 A1 * | 12/2009 | Lee | 257/401 |
| 2011/0012201 A1 * | 1/2011 | Yagishita et al. | 257/347 |
| 2011/0133292 A1 * | 6/2011 | Lee et al. | 257/401 |
| 2011/0147839 A1 * | 6/2011 | Yagishita et al. | 257/347 |

* cited by examiner

*Primary Examiner* — Jarrett Stark
*Assistant Examiner* — Michele Fan
(74) *Attorney, Agent, or Firm* — Cantor Colburn LLP; Richard Kotulak

(57) ABSTRACT

A multiple gate field effect transistor and a planar field effect transistor formed in the same substrate each have a top planar surface underneath each corresponding gate that are co-planar with one another and also co-planar with a top surface of a shallow trench isolation region located therebetween. The relatively older planar FET fabrication technology has added to it the relatively newer MUGFET fabrication technology without disruption to the planar fabrication technology and with relatively little added cost.

18 Claims, 5 Drawing Sheets

INTEGRATED PLANAR AND MULTIPLE GATE FETS

BACKGROUND

The present invention relates generally to semiconductor transistor design, and, more particularly, to a planar field effect transistor (FET) integrated together with a multiple gate FET on the same substrate where the two types of FETs have top surfaces underneath the corresponding gates that are co-planar with each other, as well as with the top surface of an associated shallow trench isolation region located therebetween.

In the art of semiconductor transistor design it is known to integrate planar FETs with multiple gate FETs (MUGFETs or FINFETs) on the same substrate. However, heretofore it has been unknown to provide a structure and corresponding method for integrating a MUGFET and a planar FET on the same substrate where the top of the MUGFET underneath the gate is co-planar with the top of the planar FET underneath the gate as well as being co-planar with the top of an associated shallow trench isolation (STI) region located therebetween and where the relatively older planar FET technology has added to it the relatively newer MUGFET technology without disruption to the planar technology and with relatively little added cost.

BRIEF SUMMARY

According to an embodiment of the invention, a multiple gate field effect transistor and a planar field effect transistor formed in the same substrate each have a top planar surface underneath the corresponding gate of each FET that are co-planar with one another and are also both co-planar with a top surface of a shallow trench isolation located therebetween. The relatively older planar FET fabrication technology has added to it the relatively newer MUGFET fabrication technology without disruption to the planar fabrication technology and with relatively little added cost.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other features and advantages of the invention are apparent from the following detailed description in conjunction with the accompanying drawings in which:

FIG. 2, including

FIG. 3, including

FIG. 4, including FIG. 5, including

DETAILED DESCRIPTION

Figure 1:
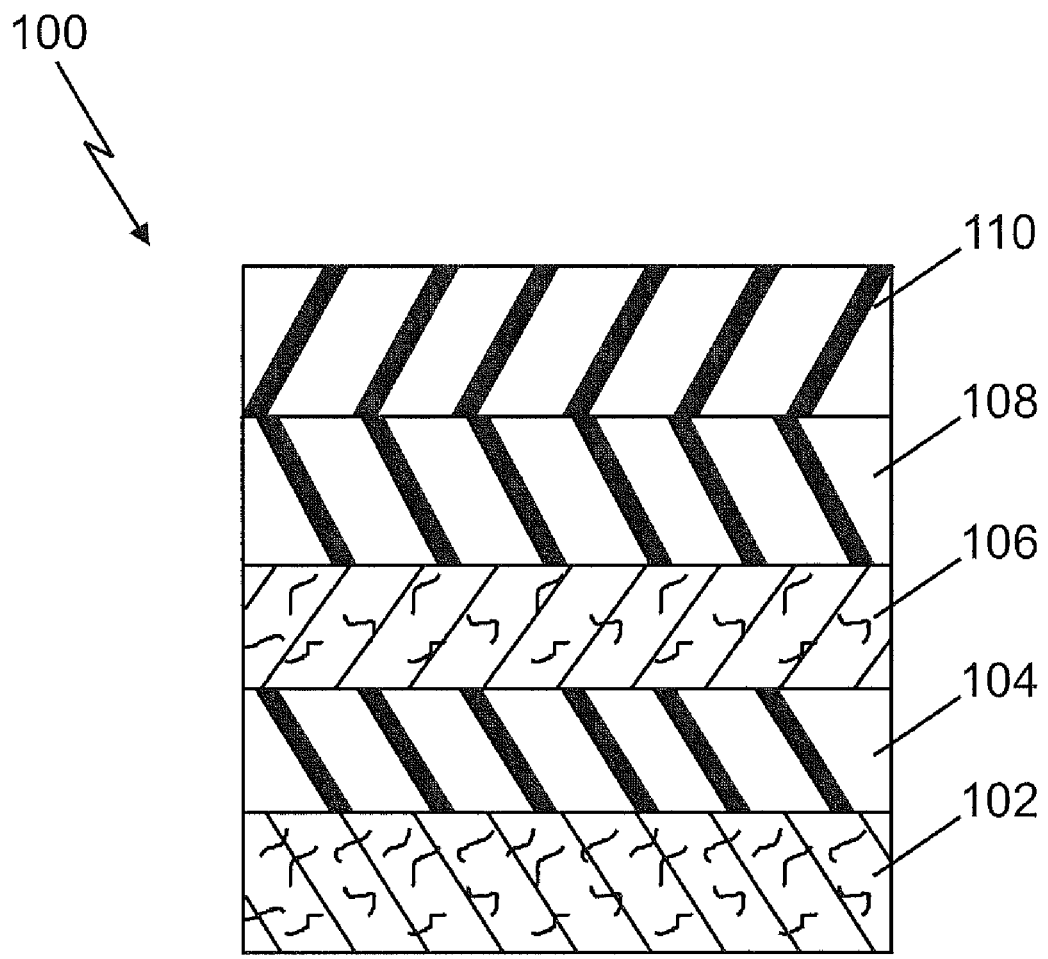
FIG. 1 is a cross sectional view of a portion of a SOI semiconductor wafer used as the starting substrate for the formation of an integrated planar FET and a multiple gate FET according to an embodiment of the invention.

Referring to FIG. 1, there is shown a cross sectional view of a portion of a silicon-on-insulator (SOI) semiconductor wafer 100 that is used as the starting substrate for the formation of both an integrated planar FET and a multiple gate FET therein, according to an embodiment of the invention as described and illustrated in greater detail hereinafter. A lower or bottom bulk silicon substrate layer 102 is provided. Located on a top surface of the lower silicon substrate layer 102 is a buried oxide (BOX) insulator layer 104. Located on a top surface of the BOX layer 104 is an upper layer 106 of silicon, in which the resulting planar and multiple gate FET devices (FIG. 5) are ultimately formed together in the same portion of the semiconductor substrate 100. Located on a top surface of the upper silicon layer 106 is an oxide pad film 108 and on top of that is a nitride pad film 110. Those skilled in the art will realize that the oxide pad film 108 may instead be placed on top of the nitride pad film 110. The pad oxide film 108 may be grown using standard oxidation techniques and may typically be in the range of about 3 nanometers (nm) to about 14 nm. Nitride films may be utilized as the pad films 110, although other materials may also be used. The nitride pad film 110 may typically be in the range of about 30 nm to about 120 nm.

Figure 2A:
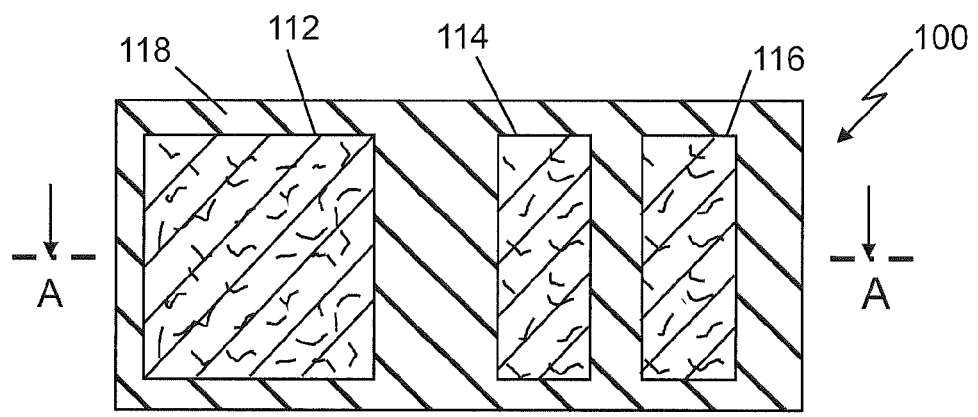
FIGS. 2A and 2B, are top and cross sectional views of integrated planar and multiple gate FETs formed within the SOI substrate according to an embodiment of the invention after initial processing steps.
Figure 2B:
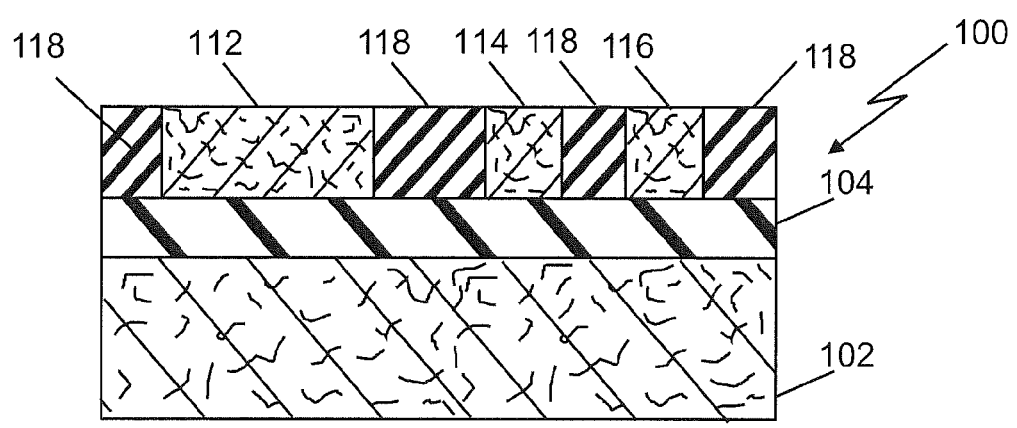

Referring to FIG. 2, there is shown both a top view (FIG. 2A) and a cross sectional view (FIG. 2B) of the SOI substrate 100 according to an embodiment of the invention, after several initial processing or fabrication steps that ultimately form both the integrated planar FET and the multiple gate FET in the SOI substrate 100. Initially, a standard planar CMOS process step may be performed of masking the upper silicon layer 106 to define the location of several silicon islands 112, 114, 116 that will be formed in the upper silicon layer 106 of the SOI substrate 100. These silicon islands 112-116 represent active device regions for the planar FET and the MUGFET that will ultimately be formed in the SOI substrate 100, as described in detail hereinafter. Next, a step is performed where unmasked regions 118 of the upper silicon layer 106 of the SOI substrate are etched to remove the silicon from the layer 106 in those unmasked regions 118. Then, the regions 118 in the upper silicon layer 106 where the silicon was removed by etching are filled in with an STI insulator material. This step is then followed by a step of polishing, e.g., a chemical mechanical polishing (CMP) step of the resulting silicon regions 112-116 and the STI regions 118. The pad films 108, 110 are also removed in this step.

Figure 3A:
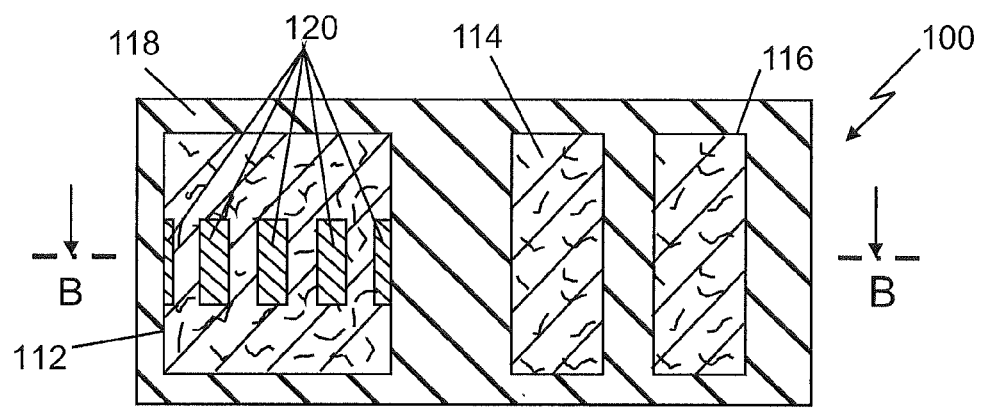
FIGS. 3A and 3B, are top and cross sectional views of the integrated planar and multiple gate FETs within the SOI substrate according to an embodiment of the invention after further processing steps.
Figure 3B:
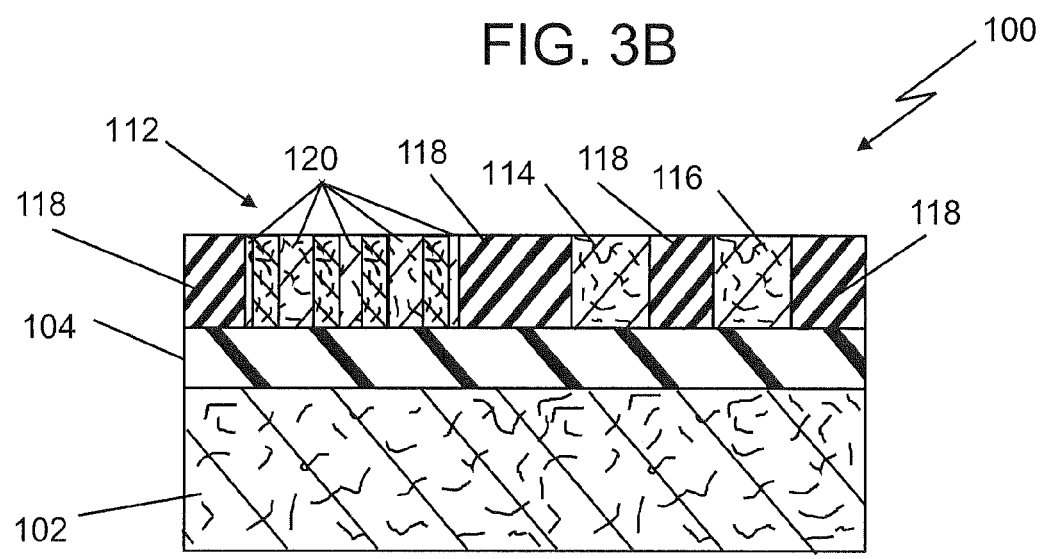

Referring to FIG. 3, is shown both a top view (FIG. 3A) and a cross sectional view (FIG. 3B) of the SOI substrate 100 according to an embodiment of the invention following some additional processing or fabrication steps that ultimately form both the integrated planar FET and the multiple gate FET in the SOI substrate 100. Up to this point, the steps described above with respect to FIG. 2 comprise standard planar FET silicon processing steps. Next, a portion of the silicon island or region 112 that will eventually form the MUGFET undergoes a masking step and then an etching step in which unmasked regions of the silicon region 112 are selectively etched to form a plurality of trenches 120 where the silicon within the region 112 has been removed down to the BOX layer 104. This is best seen in FIG. 3A. These trench regions 120 will eventually form the channels for the MUGFET. Silicon remains in the portions of the region 112 where no trenches 120 have been formed. By etching the silicon region 112 for the MUGFET after the STI regions 118 have been formed, the base planar CMOS process has not been disrupted and any additional costs of fabrication are relatively small. Further, as seen in FIG. 3B, the top of the silicon region 112 where the MUGFET will be formed (i.e., the MUGFET "active regions") is coplanar with the top of the silicon regions 114, 116 for the planar FET and is also co-planar with the top of the STI regions 118.

Figure 4A:
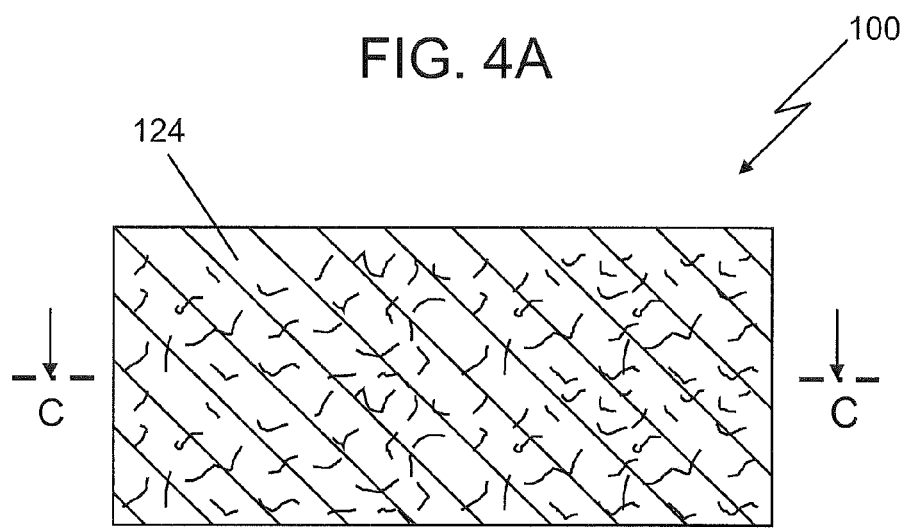
FIGS. 4A and 4B, are top and cross sectional views of the integrated planar and multiple gate FETs within the SOI substrate according to an embodiment of the invention after still further processing steps.
Figure 4B:
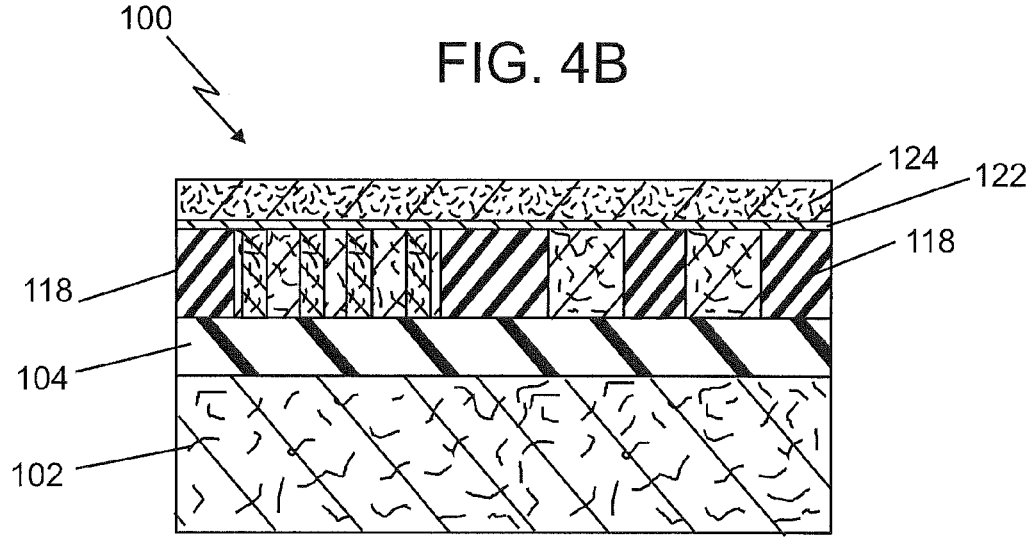

Referring to FIG. 4, there is shown both a top view (FIG. 4A) and a cross sectional view (FIG. 4B) of the SOI substrate 100 according to an embodiment of the invention, after further processing or fabrication steps that ultimately form both the integrated planar FET and the multiple gate FET in the SOI substrate 100. A gate dielectric layer 122 is formed by deposition or reaction and is located across the entire upper surface of the layer containing the STI regions 118, the planar FET silicon regions 114, 116, and the MUGFET silicon region 112 with the trenches 120 formed therein. The gate dielectric layer 122 may comprise an oxide or other insulating material. Located on a top surface of the gate dielectric layer 122 is a silicon gate layer 124 in which the gates of both the planar FET and the MUGFET will be formed. The silicon gate layer 124 may be formed by a deposition process and may be planarized in a step.

Figure 5A:
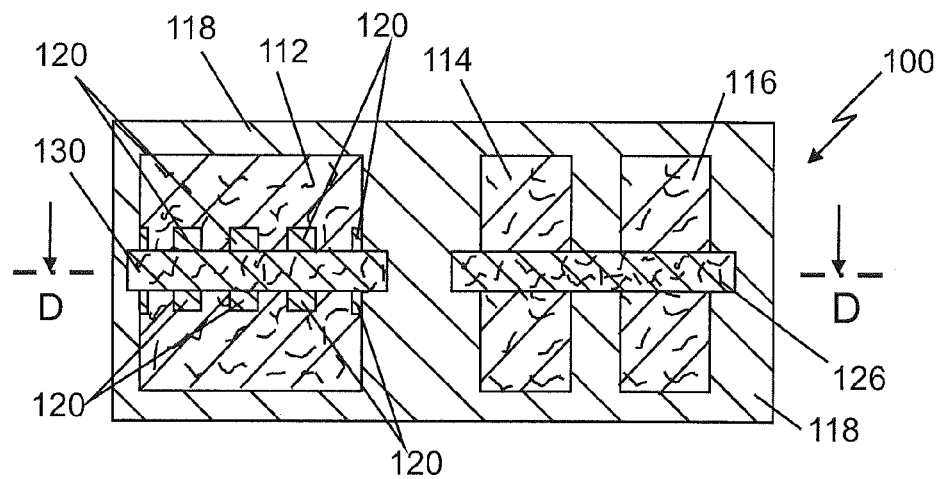
FIGS. 5A and 5B, are top and cross sectional views of the integrated planar and multiple gate FETs formed within the SOI substrate according to an embodiment of the invention.
Figure 5B:
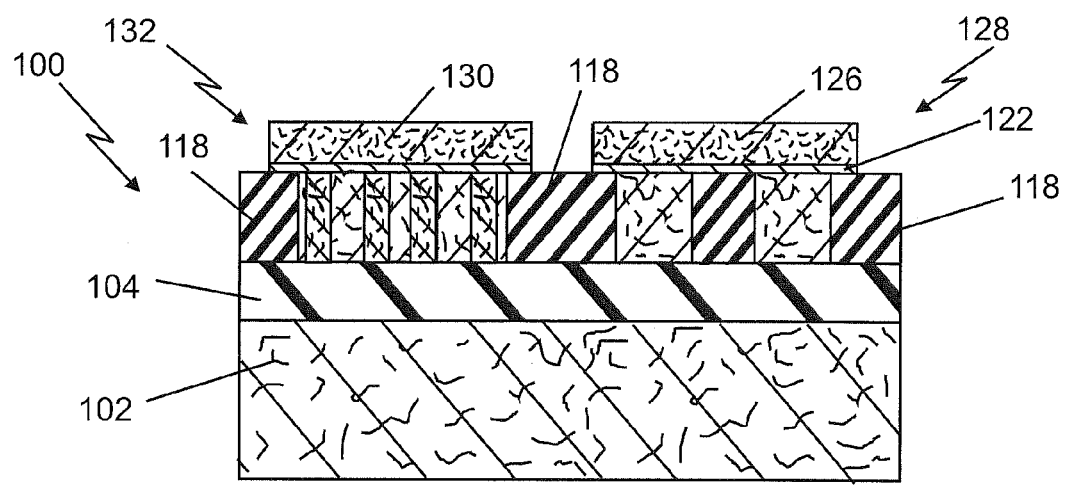

Referring to FIG. 5, there is shown both a top view (FIG. 5A) and a cross sectional view (FIG. 5B) of the SOI substrate 100 according to an embodiment of the invention after some additional processing steps. The silicon gate layer 124 is masked in a step, where the masking step defines the regions on the gate layer 124 in which the gates for both the planar FET and the MUGFET will be formed. Next, the silicon gate layer 124 is etched to form a gate region 126 for the standard planar FET 128 and to also form a gate region 130 for the MUGFET 132. The gates 126, 130 may be formed at the same time in the etching step. This etching step may involve some adjustment to the planar FET gate etching for proper formation of the MUGFET gate 130 by using a special gate mask and/or by allowing for extra etch time to properly form the MUGFET gate 130. As seen in FIG. 5B, the MUGFET gate 130 covers a portion of each of the trenches 120 formed in the silicon island 112. The result is the MUGFET 132 integrated together on the same SOI substrate 100 with a standard CMOS planar FET 128.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. A method of fabricating a planar field effect transistor (FET) and a multiple gate FET (MUGFET) together in a multiple layer substrate, comprising:
    etching an upper layer in the substrate to form a first active device region for the MUGFET and a pair of second active device regions for the planar FET;
    filling etched regions in the upper layer of the substrate with a shallow trench isolation (STI) material to form a plurality of STI filled regions;
    forming a plurality of trenches in the first active device region;
    forming a first gate region for the MUGFET over a portion of the first active device region; and
    forming a second gate region for the planar FET over a portion of the pair of second active device regions, wherein forming a first gate region for the MUGFET over a portion of the first active device region and forming a second gate region for the planar FET over a portion of the pair of second active device regions comprises forming a dielectric layer on top of the upper layer in the substrate, forming a gate layer on top of the dielectric layer, and etching the gate layer and the dielectric layer at selective locations to form the first and second gate regions; and
    wherein top surfaces of each of the STI filled regions, the first active device region for the MUGFET, the plurality of trenches in the first active device region, and the second active device regions are all co-planar with respect to one another.

2. The method of claim 1, wherein the upper layer in the substrate comprises silicon.

3. The method of claim 1, wherein the substrate comprises a silicon-on-insulator (SOI) substrate having a lower layer of silicon, a layer of insulator disposed on top of the lower layer of silicon, and the upper layer comprises silicon.

4. The method of claim 1, wherein filling etched regions in the upper layer of the substrate with an STI material fills the etched regions with the STI material to a level that is the same as that of the first active region and the pair of second active regions.

5. The method of claim 1, wherein forming a plurality of trenches in the first active device region comprises selectively etching portions of the first active device region to remove the material of the first active device region, wherein the plurality of trenches in the first active device region comprises channels for the MUGFET.

6. The method of claim 1, further comprising forming at least one oxide pad film layer on top of the upper layer in the substrate prior to etching an upper layer in the substrate to form a first active device region for the MUGFET and a pair of second active device regions for the planar FET.

7. The method of claim 6, wherein after filling etched regions in the upper layer of the substrate with an STI material, removing the at least one oxide pad film layer.

8. A method of fabricating a planar field effect transistor (FET) and a multiple gate FET (MUGFET) together in a multiple layer substrate, comprising:
　forming at least one oxide pad film layer on top of an upper layer in the substrate;
　etching the at least one oxide pad film layer and the upper layer in the substrate to form a first active device region for the MUGFET and a pair of second active device regions for the planar FET;
　filling etched regions in the upper layer of the substrate with a shallow trench isolation (STI) material to form a plurality of STI filled regions;
　polishing the filled STI regions, the first active device region and the pair of second active device regions, the polishing including removing the at least one oxide pad film layer;
　forming a plurality of trenches in the first active device region;
　forming a first gate region for the MUGFET over a portion of the first active device region;
　forming a second gate region for the planar FET over a portion of the pair of second active device regions;
　wherein top surfaces of each of the STI filled regions, the first active device region for the MUGFET, the plurality of trenches in the first active device region, and the second active device regions are all co-planar with respect one another.

9. The method of claim 8, wherein the step of polishing comprises a chemical mechanical polishing step.

10. A method of fabricating a planar field effect transistor (FET) and a multiple gate FET (MUGFET) together in a silicon-on-insulator (SOI) substrate, comprising:
　removing selected portions of an upper silicon layer in the SOI substrate to form a first active device region for the MUGFET and a pair of second active device regions for the planar FET;
　filling the removed selected portions in the upper silicon layer of the SOI substrate with a shallow trench isolation (STI) material to form a plurality of STI filled regions;
　forming a plurality of trenches in the first active device region;
　forming a first gate region for the MUGFET over a portion of the first active device region; and
　forming a second gate region for the planar FET over a portion of the pair of second active device regions, wherein forming a first gate region for the MUGFET over a portion of the first active device region and forming a second gate region for the planar FET over a portion of the pair of second active device regions comprises forming a dielectric layer on top of the upper silicon layer in the SOI substrate, forming a gate layer on top of the dielectric layer, and etching the gate layer and the dielectric layer at selective locations to form the first and second gate regions; and
　wherein top surfaces of each of the STI filled regions, the first active device region for the MUGFET, the plurality of trenches in the first active device region, and the second active device regions are all co-planar with respect to one another.

11. The method of claim 10, wherein removing selected portions of an upper silicon layer in the SOI substrate to form a first active device region for the MUGFET and a pair of second active device regions for the planar FET comprises etching selected portions of the upper silicon layer in the SOI substrate.

12. The method of claim 10, wherein filling etched regions in the upper layer of the substrate with an STI material fills the etched regions with the STI material to a level that is the same as that of the first active region and the pair of second active regions.

13. The method of claim 10, wherein forming a plurality of trenches in the first active device region comprises selectively etching portions of the first active device region to remove the material of the first active device region, wherein the plurality of trenches in the first active device region comprises channels for the MUGFET.

14. The method of claim 10, further comprising forming at least one oxide pad film layer on top of the upper silicon layer in the SOI substrate prior to etching an upper silicon layer in the SOI substrate to form a first active device region for the MUGFET and a pair of second active device regions for the planar FET.

15. A method of fabricating a planar field effect transistor (FET) and a multiple gate FET (MUGFET) together in a silicon-on-insulator (SOI) substrate, comprising:
　forming at least one oxide pad film layer on top of an upper silicon layer in the SOI substrate;
　removing selected portions of the upper silicon layer in the SOI substrate to form a first active device region for the MUGFET and a pair of second active device regions for the planar FET;
　filling the removed selected portions in the upper silicon layer of the SOI substrate with a shallow trench isolation (STI) material to form a plurality of STI filled regions;
　polishing the filled STI regions, the first active device region and the pair of second active device regions, the polishing including removing the at least one oxide pad film layer;
　forming a plurality of trenches in the first active device region;
　forming a first gate region for the MUGFET over a portion of the first active device region; and
　forming a second gate region for the planar FET over a portion of the pair of second active device regions;
　wherein top surfaces of each of the STI filled regions, the first active device region for the MUGFET, the plurality of trenches in the first active device region, and the second active device regions are all co-planar with respect to one another.

16. A method of fabricating a planar field effect transistor (FET) and a multiple gate FET (MUGFET) together in a silicon-on-insulator (SOI) substrate, comprising:
　etching selected portions of an upper silicon layer in the SOI substrate to form a first active device region for the MUGFET and a pair of second active device regions for the planar FET;
　filling the removed selected portions in the upper silicon layer of the SOI substrate with a shallow trench isolation (STI) material to form a plurality of STI filled regions;
　forming a plurality of trenches in the first active device region;
　forming a dielectric layer on top of the upper silicon layer in the SOI substrate;

forming a gate layer on top of the dielectric layer; and etching the gate layer and the dielectric layer at selective locations to form a first gate region for the MUGFET over a portion of the first active device region and a second gate region for the planar FET over a portion of the pair of second active device regions;

wherein top surfaces of each of the STI filled regions, the first active device region for the MUGFET, the plurality of trenches in the first active device region, and the second active device regions are all co-planar with respect to one another.

17. The method of claim 16, wherein forming a plurality of trenches in the first active device region comprises selectively etching portions of the first active device region to remove the material of the first active device region, wherein the plurality of trenches in the first active device region comprises channels for the MUGFET.

18. The method of claim 16, further comprising forming at least one oxide pad film layer on top of the upper silicon layer in the SOI substrate prior to etching an upper silicon layer in the SOI substrate to form a first active device region for the MUGFET and a pair of second active device regions for the planar FET, and wherein after filling the etched regions in the upper silicon layer of the SOI substrate with an STI material, removing the at least one oxide pad film layer and polishing the filled STI regions, the first active device region and the pair of second active device regions.

* * * * *